(12) United States Patent
Iwata

(10) Patent No.: US 8,946,611 B2
(45) Date of Patent: Feb. 3, 2015

(54) SOLID-STATE IMAGING ELEMENT AND MANUFACTURING METHOD THEREOF, AND ELECTRONIC INFORMATION DEVICE

(75) Inventor: Hiroshi Iwata, Osaka (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 836 days.

(21) Appl. No.: 13/141,567

(22) PCT Filed: Dec. 18, 2009

(86) PCT No.: PCT/JP2009/071180
§ 371 (c)(1),
(2), (4) Date: Aug. 22, 2011

(87) PCT Pub. No.: WO2010/074007
PCT Pub. Date: Jul. 1, 2010

(65) Prior Publication Data
US 2012/0025060 A1 Feb. 2, 2012

(30) Foreign Application Priority Data
Dec. 24, 2008 (JP) ................................. 2008-328592

(51) Int. Cl.
*H04N 5/335* (2011.01)
*H04N 9/07* (2006.01)
(Continued)

(52) U.S. Cl.
CPC .......... *H04N 9/045* (2013.01); *H01L 27/14603* (2013.01); *H04N 5/347* (2013.01); *H04N 5/37457* (2013.01); *H01L 27/14621* (2013.01); *H01L 31/02024* (2013.01)
USPC ........ 250/208.1; 250/226; 348/276; 348/308; 257/231; 257/291; 257/432; 257/448; 257/E31.127; 438/70; 438/73

(58) Field of Classification Search
USPC ............ 250/208.1, 214.1, 226; 348/275, 276, 348/294, 302, 308, 311; 438/60, 70, 73, 75, 438/77; 257/431, 432, 443, 444, 448, 291, 257/222, 231, 233, E31.127, E31.058, 257/E31.073, E33.053, E27.133
See application file for complete search history.

(56) References Cited

U.S. PATENT DOCUMENTS 6,870,207 B2 * 3/2005 Taylor ............................ 257/217
8,183,609 B2 * 5/2012 Kudoh ............................ 257/292
(Continued)

FOREIGN PATENT DOCUMENTS

JP 10-256521 A 9/1998
JP 2000-078475 A 3/2000
(Continued)

*Primary Examiner* — John Lee
(74) *Attorney, Agent, or Firm* — Edwards Wildman Palmer LLP; David G. Conlin

(57) ABSTRACT

A color filter is formed using a simple manufacturing method, and bias application to a pixel separating electrode allows sensitivity in low illumination intensity to be improved. In a solid-state imaging element, in which a plurality of unit pixel sections are disposed two dimensionally on a side closer to a front surface of a semiconductor substrate or a semiconductor layer, each unit pixel section having a light receiving section for generating a signal charge by light irradiation, an adjoining unit pixel section is formed in the same color to allow for lesser alignment accuracy of the color filter. A pixel separating electrode is formed in the adjoining unit pixel section, and a signal charge is shared by bias application during low illumination intensity, thereby improving an effective photodiode area.

31 Claims, 9 Drawing Sheets

(51) Int. Cl.
*H01L 27/146* (2006.01)
*H01L 31/18* (2006.01)
*H04N 9/04* (2006.01)
*H04N 5/347* (2011.01)
*H04N 5/3745* (2011.01)
*H01L 31/02* (2006.01)

(56) References Cited

U.S. PATENT DOCUMENTS

| | | | |
|---|---|---|---|
| 8,242,547 B2 * | 8/2012 | Kudoh | 257/292 |
| 8,309,383 B2 * | 11/2012 | Kudoh | 438/48 |
| 8,466,998 B2 * | 6/2013 | Suzuki | 348/350 |
| 8,471,312 B2 * | 6/2013 | Kudoh | 257/292 |
| 2008/0156966 A1 * | 7/2008 | Hsieh | 250/208.1 |
| 2009/0224351 A1 * | 9/2009 | Hsieh | 257/444 |
| 2012/0025060 A1 * | 2/2012 | Iwata | 250/208.1 |

FOREIGN PATENT DOCUMENTS

| | | |
|---|---|---|
| JP | 2000-294758 A | 10/2000 |
| JP | 2004-336469 A | 11/2004 |
| JP | 2005-167958 A | 6/2005 |
| JP | 2008-166780 A | 7/2008 |

* cited by examiner

FIG.6
(a) 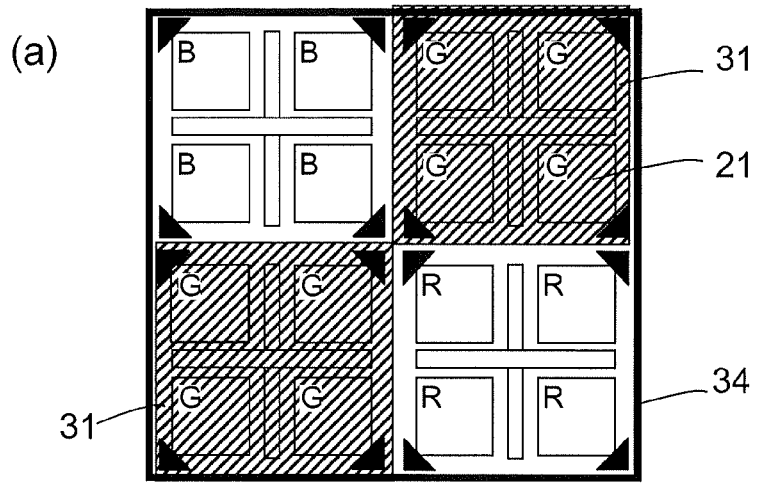
(b) 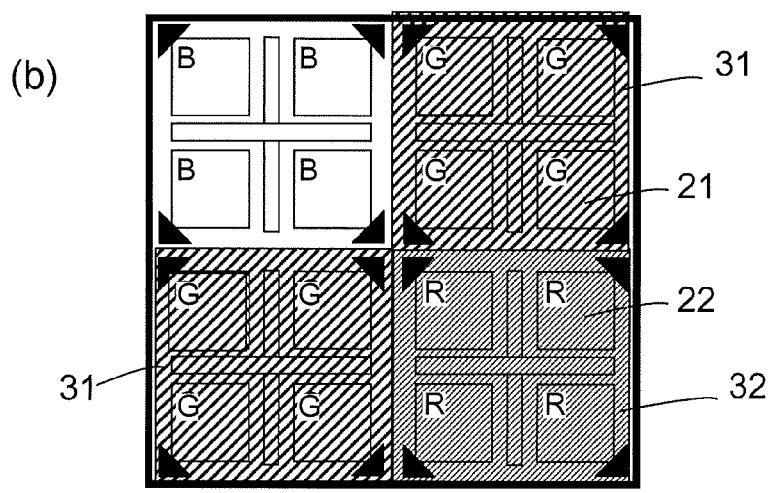
(c) 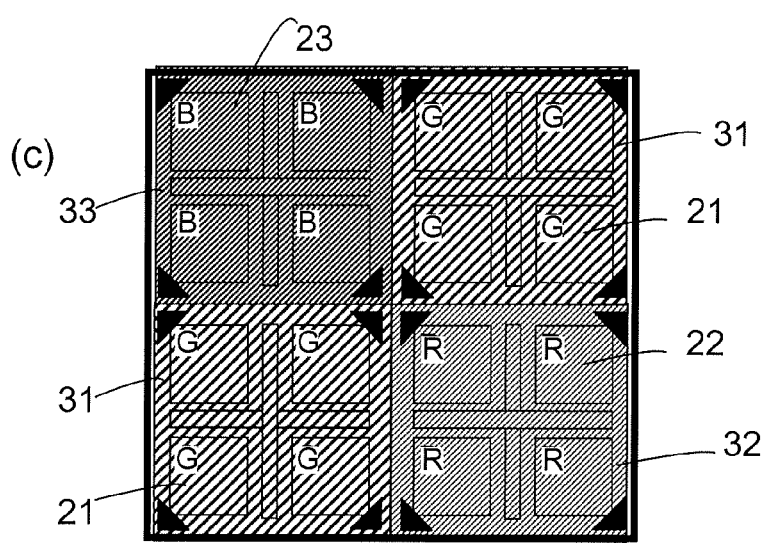

FIG.9
(a)
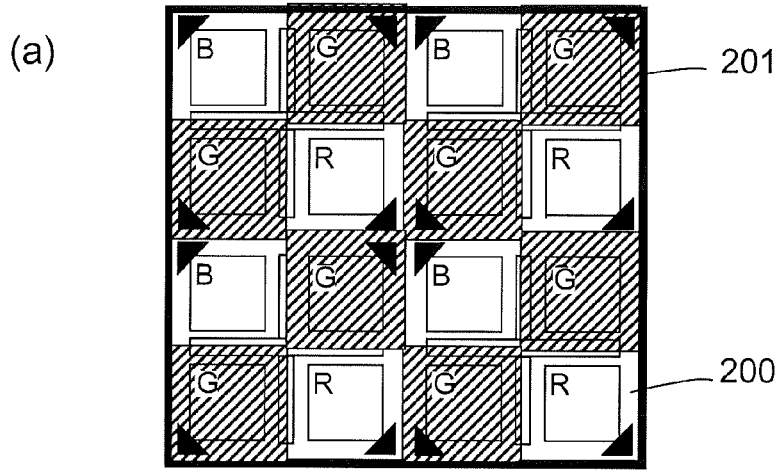
(b)
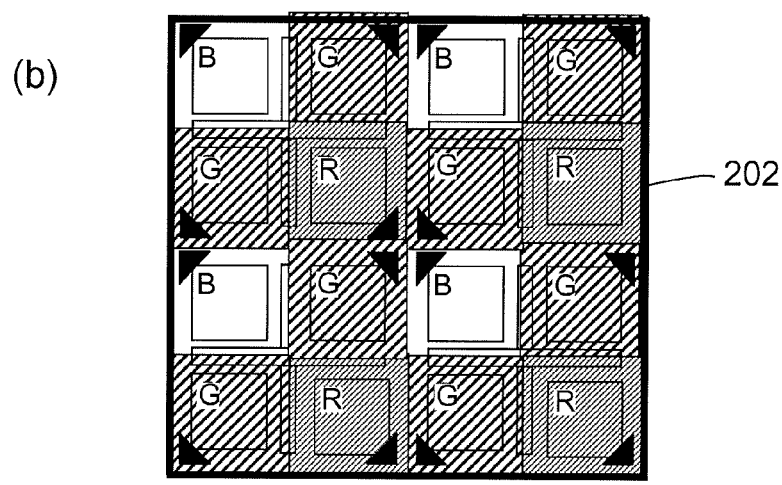
(c)
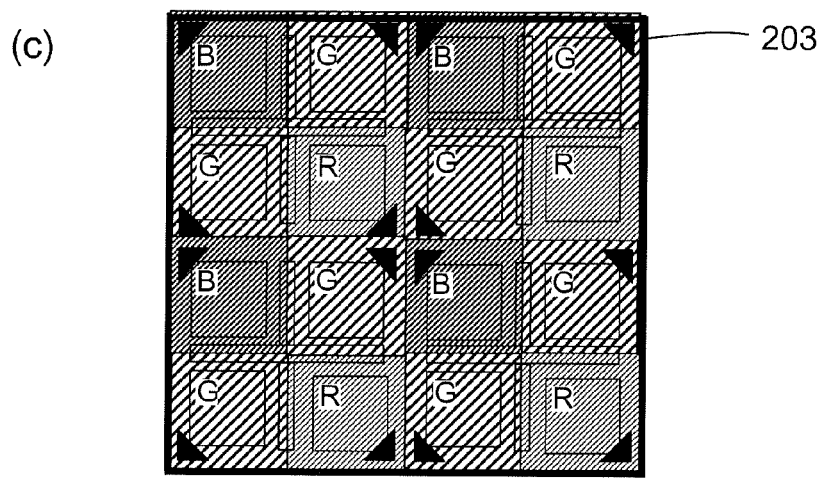

SOLID-STATE IMAGING ELEMENT AND MANUFACTURING METHOD THEREOF, AND ELECTRONIC INFORMATION DEVICE

CROSS-REFERENCE TO RELATED APPLICATION

This application claims under 35 U.S.C. §119(a) the benefit of Japanese Patent Application No. 2008-328592 filed Dec. 24, 2008 and International Application No. PCT/JP2009/071180 filed Dec. 18, 2009, the entire contents of which are incorporated herein by reference.

TECHNICAL FIELD

The present invention relates to a solid-state imaging element constituted of semiconductor elements for performing a photoelectric conversion on, and capturing an image of, incident light; a method for manufacturing the solid-state imaging element; and an electronic information device, such as a digital camera (e.g., a digital video camera or a digital still camera), an image input camera (e.g., a monitoring camera), a scanner, a facsimile machine, a television telephone device, and a camera-equipped cell phone device, which the electronic information device includes the solid-state imaging element as an image input device used in an imaging section thereof.

BACKGROUND ART

CCD image sensors and CMOS image sensors are conventionally known as solid-state imaging elements for converting image light from a subject into an electric signal. Among them, the CMOS image sensors include a plurality of light receiving sections (a plurality of photodiodes) for generating a signal charge by light irradiation, and an amplifying transistor (MOS transistor) for reading the signal charge generated at the light receiving sections as an imaging signal, both of which are provided on a common substrate. The CMOS image sensors thus have advantages of low power consumption, low cost performance by the use of standard CMOS processing technique such as system LSI, and multiple usages.

In such CMOS image sensors, with the tendency of the downsizing of pixels in recent years, it is important to secure the sensitivity in low illumination intensity. Patent Literature 1 discloses a conventional solid-state imaging element equipped with high sensitivity pixels and low sensitivity pixels.

FIG. 8 is a plan view of a partial imaging region, illustrating a pixel arrangement for improving the sensitivity at low illumination intensity in the convent ional solid-state imaging element disclosed in Patent Literature 1.

As illustrated in FIG. 8, the conventional solid-state imaging element disclosed in Patent Literature 1 includes pixels with a large area indicated by uppercase letters, R, G and B, as well as pixels with a small area indicated by lowercase letters, r, g and b, i.e., high sensitivity photoelectric conversion elements and low sensitivity photoelectric conversion elements, arranged checkerwise. When imaging signals from adjoining high and low sensitivity photoelectric conversion elements of the same color are synthesized and obtained, a synthesized signal can be regarded as a signal from a single pixel positioned at the centroid of the two pixels (which is indicated by a dot "•" in FIG. 8), resulting in image signals in a virtual checkerwise arrangement. A pixel with a large area and a pixel with a small area of the same color are paired and they are arranged in a Bayer arrangement. Therefore, the dynamic range can be expanded without substantial lowering of resolution in a lengthwise direction and a widthwise direction.

In the CMOS image sensors, it is generally known to use color filters of three primary colors, such as R, G and B (Red, Green and Blue respectively), in synthesizing images. This is introduced in Patent Literature 2, and the like.

FIGS. 9(*a*) to 9(*c*) are each a plan view of an essential part, illustrating by stages a color filter forming step of a conventional solid-state imaging element disclosed in Patent Literature 2.

First, as illustrated in FIG. 9(*a*), a G filter 201 is formed on a pixel region 200, which is shared by four pixels, in such a manner that G (green) is arranged among the Bayer arrangement of the three primary colors, R, G and B. Next, as illustrated in FIG. 9(*b*), an R filter 202 is formed in such a manner that R (red) is arranged among the Bayer arrangement of the three primary colors, R, G and B. Then, as illustrated in FIG. 9(*c*), a B filter 203 is formed in such a manner that B (blue) is arranged among the Bayer arrangement of the three primary colors, R, G and B. As a result, a pixel array of 2×2 units (shared by four units) is formed, which is arranged in a two-dimensional Bayer arrangement.

Patent Literature 1: Japanese Laid-Open Publication No. 2004-336469
Patent Literature 2: Japanese Laid-Open Publication No. 2000-294758

DISCLOSURE OF THE INVENTION

Problems to be Solved by the Invention

In the conventional solid-state imaging element disclosed in Patent Literature 1, however, it is necessary to form the high sensitivity photoelectric conversion elements and low sensitivity photoelectric conversion elements in different steps, bringing about a problem for manufacturing feasibility.

In the conventional solid-state imaging element disclosed in Patent Literature 2, high accuracy is required in the overlapping portions of respective filters due to the problem of cross talk and the like, in accordance with miniaturization of the pixels, which brings about a problem of causing manufacturing restrictions.

The present invention is intended to solve the conventional problems described above. It is an objective of the present invention to provide a solid-state imaging element and a method for manufacturing the solid-state imaging element. In the solid-state imaging element, a pixel separating electrode is disposed in a pixel separating region and a given voltage is applied to the pixel separating electrode to allow adjoining pixels to share a signal charge. As a result, it becomes unnecessary to form the high sensitivity photoelectric conversion elements and low sensitivity photoelectric conversion elements indifferent steps as done conventionally; they can be manufactured more easily; and the sensitivity in low illumination intensity can be significantly improved. It is also an objective of the present invention to provide an electronic information device, such as a camera-equipped cell phone device, which includes the solid-state imaging element as an image input device used in an imaging section thereof.

The present invention is intended to solve the conventional problems described above. It is an objective of the present invention to provide a solid-state imaging element and a method for manufacturing the solid-state imaging element. In the solid-state imaging element, a pixel separating electrode is disposed in a pixel separating region and voltage is applied to the pixel separating electrode to allow adjoining pixels to share a signal charge. As a result, even if the miniaturization of the pixels progresses, it allows a plurality of pixels to be as one and the area of color filters to be enlarged, thereby allowing for significantly lesser accuracy in the overlapping portion of respective color filters. It is also an objective of the present invention to provide an electronic information device, such as a camera-equipped cell phone device, which includes the solid-state imaging element as an image input device used in an imaging section thereof.

Means for Solving the Problem

A solid-state imaging element according to the present invention is provided, in which a plurality of unit pixel sections are disposed two dimensionally on a side closer to a front surface of a semiconductor substrate or a semiconductor layer, each unit pixel section having a light receiving section for generating a signal charge by light irradiation, the solid-state imaging element including: an opposite conductivity type semiconductor region, conductivity of which is opposite of that of the light receiving section; and a pixel separating electrode thereabove, where the opposite conductivity type semiconductor region and the pixel separating electrode are disposed in between four unit pixel sections adjacent to one another, wherein a given voltage is applied to the pixel separating electrode to allow a signal charge to be shared by the four unit pixel sections, thereby achieving the objective described above.

Further, a solid-state imaging element according to the present invention is provided, in which light receiving sections for generating a signal charge by light irradiation are provided on a side closer to a front surface of a semiconductor substrate or a semiconductor layer, and a plurality of unit pixel sections are disposed two dimensionally, each unit pixel section being provided with an electric charge transferring section, adjacent to the light receiving sections, for transferring a signal charge from the light receiving sections, where: the light receiving sections are formed in a square or rectangle in a plan view; an opposite conductivity type semiconductor region, conductivity of which is opposite of that of the light receiving section, and a pixel separating electrode thereabove are disposed in between four unit pixel sections, which are adjacent to two sides of the light receiving section that does not come in contact with the electric charge transferring section and which are adjacent to one another; and a given voltage is applied to the pixel separating electrode to allow a signal charge to be shared by the four unit pixel sections, thereby achieving the objective described above.

Preferably, in a solid-state imaging element according to the present invention, the four unit pixel sections are an adjoining 2×2 unit.

Still preferably, in a solid-state imaging element according to the present invention, the opposite conductivity type semiconductor region and the pixel separating electrode thereabove are in a cross shape in a plan view, formed in between the four unit pixel sections.

Still preferably, in a solid-state imaging element according to the present invention, a red filter, green filters and a blue filter are formed in a given color arrangement above a pixel region with an interlayer insulation film interposed therebetween, in such a manner to correspond to each adjoining unit pixel section consisting of the four unit pixel sections. When this is defined as a main claim, according to the solid-state imaging element of the present invention, in which a plurality of unit pixel sections are disposed two dimensionally on a side closer to a front surface of a semiconductor substrate or a semiconductor layer, each unit pixel section provided with a light receiving section for generating a signal charge by light irradiation, a red filter, green filters and a blue filter are formed in a given color arrangement above a pixel region with an interlayer insulation film interposed therebetween, in such a manner to correspond to each adjoining unit pixel section consisting of the four unit pixel sections, which are adjacent to two sides of the light receiving section and are adjacent to one another, thereby achieving the objective described above.

With claims 1 and 2 as dependent claims, Still preferably, in the solid-state imaging element according to the present invention, a semiconductor region, whose conductivity type is the opposite of that of the light receiving sections, and a pixel separating electrode thereabove are disposed in between adjoining four unit pixel sections. Further, a given voltage is applied to the pixel separating electrode. As a result, a signal charge can be shared among the four unit pixel sections. Still preferably, in the solid-state imaging element according to the present invention, the light receiving sections are formed in a square or rectangle in a plan view, an opposite conductivity type semiconductor region, conductivity of which is opposite of that of the light receiving section, and a pixel separating electrode thereabove are disposed in between four unit pixel sections, which are adjacent to two sides of the light receiving section that does not come in contact with the electric charge transferring section and which are adjacent to one another, and a given voltage is applied to the pixel separating electrode to allow a signal charge to be shared by the four unit pixel sections.

Still preferably, in a solid-state imaging element according to the present invention, the given color arrangement is such that colors of a Bayer arrangement in the unit pixel section are replaced in a four pixel unit, and when two G pixels are arranged inane of diagonal directions, a R pixel and a B pixel are arranged in the other of the diagonal directions; and an arranging order of the R pixel and the B pixel is alternately opposite, and a diagonal direction of the two G pixels is also alternately opposite.

Still preferably, in a solid-state imaging element according to the present invention, four unit pixel sections, which share a floating diffusion section, are constituted as one unit, and a signal charge of the light receiving section is transferred to the floating diffusion section.

Still preferably, in a solid-state imaging element according to the present invention, colors of a Bayer arrangement of the four unit pixel sections are replaced, and four unit pixel sections adjacent top and bottom as well as left and right of said unit pixel sections are constituted as unit pixel sections of the same color.

Still preferably, in a solid-state imaging element according to the present invention, signal charges accumulated in an adjoining unit pixel section, corresponding to a same color filter consisting of the four unit pixel sections, are transferred from the electric charge transferring section, being integrated as one pixel, when a given voltage is applied to the pixel separating electrode during low illumination intensity, and a given voltage is not applied to the pixel separating electrode during high illumination intensity, so that the four unit pixel sections become independent from one another and the signal charges are transferred from the electric charge transferring section corresponding to the unit pixel section.

Still preferably, in a solid-state imaging element according to the present invention, during the low illumination intensity, electric charges are transferred from the electric charge transferring section at one point for each adjoining unit pixel section corresponding to the same color filter consisting of the four unit pixel sections.

Still preferably, in a solid-state imaging element according to the present invention, filters of the same color are formed above the adjoining unit pixel section consisting of the adjoining four unit pixel sections.

Still preferably, in a solid-state imaging element according to the present invention, the pixel separating electrode consists of a gate oxide film and a polysilicon electrode thereon.

Still preferably, in a solid-state imaging element according to the present invention, the electric charge transferring section is provided at one of the corner portions of the light receiving section.

Still preferably, in a solid-state imaging element according to the present invention, the solid-state imaging element is an CMOS type solid-state imaging element, in which a signal charge transferred from the light receiving section to a floating diffusion section is converted into a voltage signal, is amplified and then output as an imaging signal.

A method for manufacturing a solid-state imaging element according to the present invention is provided, the method including: an opposite conductivity type semiconductor region forming step of forming an opposite conductivity type semiconductor region of a conductivity type opposite from that of a light receiving section, in between four unit pixel sections, which are adjacent to two sides of the light receiving section that do not come in contact with the electric charge transferring section and which are adjacent to one another; and a pixel separating electrode step of forming a polysilicon electrode, as a pixel separating electrode, above the opposite conductivity type semiconductor region with a gate oxide film interposed therebetween, thereby achieving the objective described above.

Preferably, in a method for manufacturing a solid-state imaging element according to the present invention, a color filter forming step of forming a Red filter, a Green filter and a Blue filter successively in any order in a given color arrangement above a pixel region with an interlayer insulation film interposed therebetween, in such a manner to correspond to each adjoining unit pixel section consisting of the four unit pixel sections.

An electronic information device according to the present invention includes the solid-state imaging element according to the present invention, as an image input device in an imaging section thereof.

The functions of the present invention having the structures described above will be described hereinafter.

In the present invention, a semiconductor region, whose conductivity type is the opposite of that of the light receiving sections, and a pixel separating electrode thereabove are disposed in between adjoining four unit pixel sections. Further, a given voltage is applied to the pixel separating electrode. As a result, a signal charge can be shared among the four unit pixel sections. In order to correspond to each of the adjoining unit pixel sections, which consist of four unit pixel sections, red filters, green filters and blue filters are formed in a given color arrangement above a pixel region with an interlayer insulation films interposed therebetween.

Thus, the pixel separating electrode is disposed in the pixel separating region, a given voltage is applied to the pixel separating electrode, and a signal charge can be shared by adjoining pixels. As a result, it becomes unnecessary to form the high sensitivity photoelectric conversion elements and low sensitivity photoelectric conversion elements in different steps as done conventionally, and they can be manufactured more easily. At the same time, the sensitivity in low illumination intensity can be significantly improved, which allows easier imaging in a darker place.

Also, the pixel separating electrode is disposed in the pixel separating region, voltage is applied to the pixel separating electrode, and a signal charge can be shared by adjoining pixels. As a result, even if the miniaturization of the pixels progresses, it allows a plurality of pixels to be as one and the area of color filters to be enlarged, thereby allowing for lesser accuracy in the overlapping portion of respective color filters.

As described above, the formation of adjoining four unit pixel sections with the same color filters allows for lesser alignment accuracy of the color filters. The pixel separating electrode is formed within adjoining four unit pixel sections to allow a signal charge to be shared by bias application during low illumination intensity. Thereby, an effective photodiode area can be increased and also the sensitivity during dark, low illumination intensity can be significantly improved.

Effects of the Invention

According to the present invention with the structures described above, voltage is applied to the pixel separating electrode, and a signal charge can be shared by adjoining pixels. Owing to these definitions, a sensitivity in accordance with illumination intensity by bias controlling of the pixel separating region can be obtained. In addition, alignment accuracy in the manufacturing of color filters can be lessened. Accordingly, the solid-state imaging element of the present invention is excellent in its photodiode characteristics, which allows it to be used in a wide variety of electronic information devices, such as a video camera, a digital camera and a camera-equipped cell phone device.

BRIEF DESCRIPTION OF THE DRAWINGS

FIG. 4(a) is a cross sectional potential diagram of a case where a gate electrode is in an OFF state during high illumination intensity. FIG. 4(b) is a cross sectional potential diagram of a case where a gate electrode is in an ON state during low illumination intensity.

FIGS. 6(a) to 6(c) are plan views illustrating a manufacturing process of a color filter forming step of a solid-state imaging element according to the present invention.

FIGS. 9(a) to 9(c) are each a plan view of an essential part, illustrating a color filter forming step of a conventional solid-state imaging element disclosed in Patent Literature 2.

Figure 1:
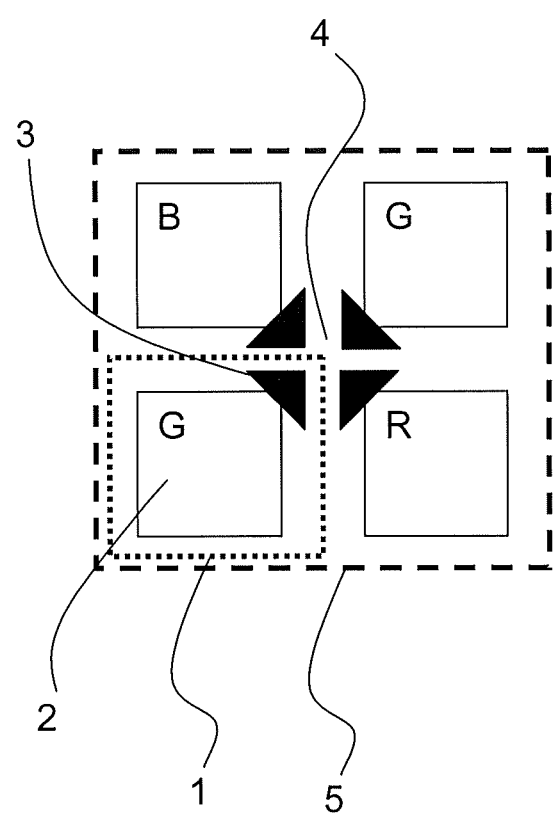
FIG. 1 is a plan view illustrating an example of a unit pixel section in a CMOS image sensor according to Embodiment 1 of the present invention.

DESCRIPTION OF THE REFERENCE NUMERALS 1 unit pixel section
2, 21, 22 photodiode
3 transfer transistor
4 floating diffusion section (FD)
5 image unit pixel section
6 adjoining unit pixel section
7 pixel separating electrode
8 macro-unit pixel section
11 element separating region
12 pixel separating region
13 surface of silicon substrate
14 gate oxide film
15 polysilicon film
30 solid-state imaging element (CMOS image sensor)
31 Green filter
32 Red filter
33 Blue filter
34 pixel region
90 electronic information device
91 solid-state imaging apparatus
92 memory section
93 display section
94 communication section
95 image output section

BEST MODE FOR CARRYING OUT THE INVENTION

Hereinafter, Embodiment 1, in which the solid-state imaging element of the present invention is applied to a CMOS image sensor, and Embodiment 2, in which the CMOS image sensor according to Embodiment 1 with the solid-state imaging element is used as an image input device in an imaging section of an electronic information device, such as a camera equipped cell phone device, will be described in detail with reference to the accompanying figures.

Embodiment 1

FIG. 1 is a plan view illustrating an example of a unit pixel section in a CMOS image sensor according to Embodiment 1 of the present invention.

In FIG. 1, a unit pixel section 1 in a CMOS image sensor as a solid-state imaging element 30 according to Embodiment 1, includes a light receiving section (photodiode 2) for receiving and performing a photoelectric conversion on incident light, an electric charge transfer transistor 3 as an electric charge transferring section provided adjacent to the photodiode 2, and a floating diffusion section 4 for temporarily accumulating signal charges transferred by the electric charge transfer transistor 3 and converting them into voltage signals. According to the voltage level of the voltage signal, the voltage signal is amplified by the amplifying transistor, and an imaging signal is output to a signal line.

The floating diffusion section 4 is shared as a destination of pixel signals of an image unit pixel section 5 to be transferred, and respective pixel signals can be independently transferred successively by the operating timing of the electric charge transfer transistor 3. The floating diffusion section 4 is shared by four pixels.

The image unit pixel section 5 is shared by four pixels, and colors are alternately replaced among the R, G and B in a Bayer arrangement. As two G pixels are arranged in a diagonal direction (from the upper right to the lower left), an R pixel and a B pixel are arranged in a reversed diagonal direction (from the upper left to the lower right). The arrangement order of the R pixel and B pixel is alternately reversed, and the arrangement of the two G pixels is also alternately in a reversed diagonal direction.

Figure 2:
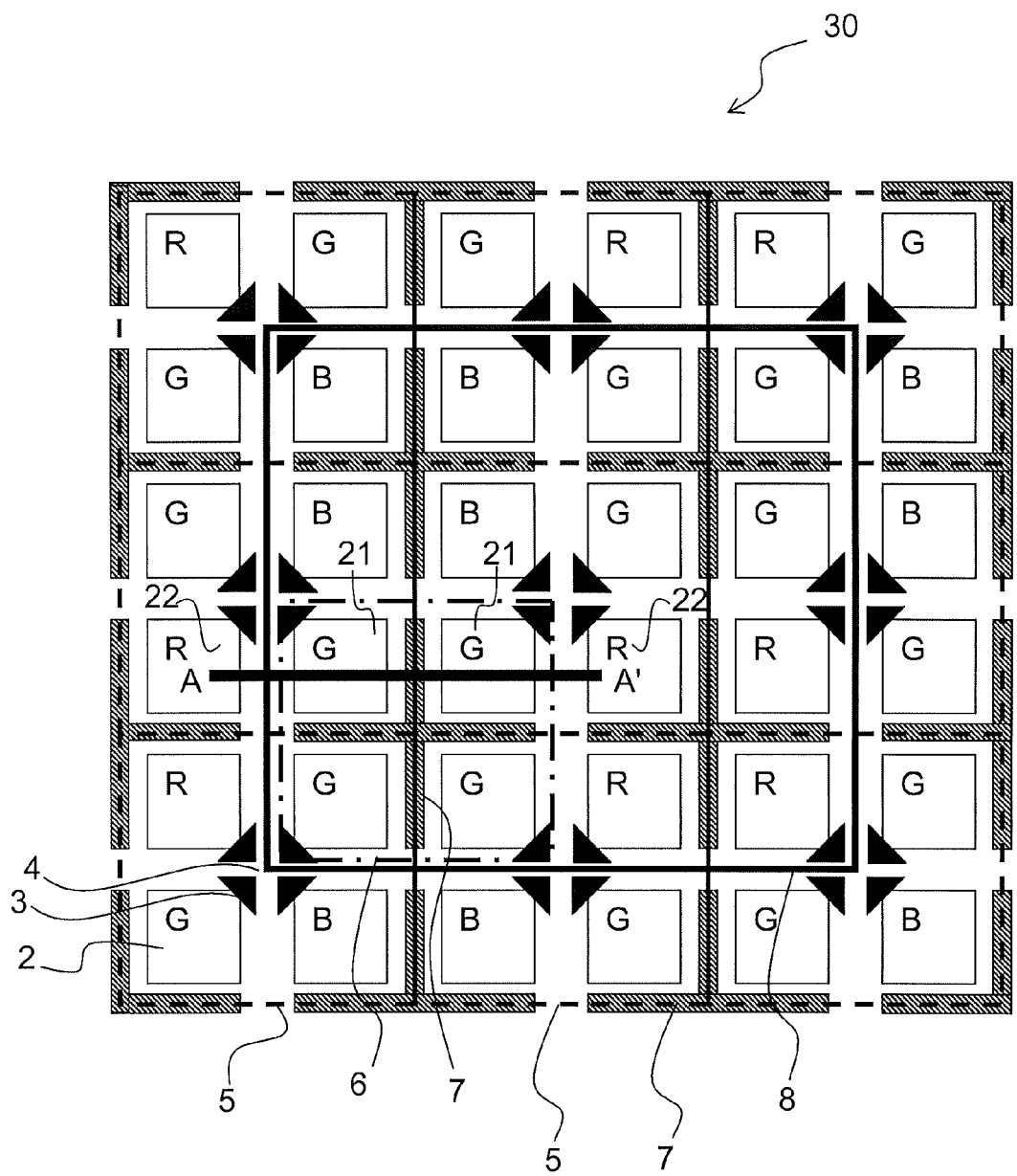
FIG. 2 is a plan view of image unit pixel sections, each shared by four pixels, in FIG. 1 arranged in a matrix.

FIG. 2 is a plan view of image unit pixel sections 5, each shared by four pixels, in FIG. 1 arranged in a matrix.

As illustrated in FIG. 2, in the arrangement of the image unit pixel sections 5 (3×3 arrangement herein), each shared by four pixels, the color of each unit pixel section 1 in a Bayer arrangement is replaced so that the colors of the unit pixel sections 1 adjacent to each other in respective image unit pixel sections 5 are the same in a lengthwise direction as well as a widthwise direction. Then, an adjoining unit pixel section 6 is formed which consists of four unit pixel sections 1 surrounded by a single dotted chain line, for example. The adjoining unit pixel section 6 surrounded by the single dotted chain line consists of the same color, the G color (or R or B color). A pixel separating electrode 7 is formed on a pixel separating region (a region whose conductivity is opposite of the light receiving section) in a cross shape in a plan view along the borderlines of four pixels (herein, it is a T-shape at an end portion). From a macroscopic point of view, a macro-unit pixel section 8 can be seen which is surrounded by a solid line and which is a 2×2 unit of a Bayer arrangement (or a color arrangement modified from the Bayer arrangement) with a large area formed by four of the same color among the three primary colors, R, G and B. In this case, the unit pixel section 1 adjacent to the pixel separating electrode 7 in a cross shape in a plan view has a color filter of a wide area and of the same color.

A case will be described where the color of respective unit pixel sections 1 in a Bayer arrangement is replaced to gather four of the same color close to one another.

With regard to the color of respective unit pixel sections 1 in a Bayer arrangement in two image unit pixel sections 5, each shared by four pixels, in the first row (in a horizontal direction), the direction of two G colors in a diagonal direction is alternately changed. Specifically, the arrangement is changed from the two G colors from the upper right to the lower left, to the two G colors from the upper left to the lower right. As a result, two B colors can be faced with each other side by side.

With regard to the color of respective unit pixel sections 1 in a Bayer arrangement in two image unit pixel sections 5, each shared by four pixels, in the first column (in a vertical direction), the direction of two G colors in a diagonal direction is alternately changed. Specifically, the arrangement is changed from the two G colors from the upper right to the lower left to the two G colors from the upper left to the lower right. Further, the line of the R and B colors from the upper left to the lower right in a diagonal direction is changed to the line of the B and R colors from the upper right to the lower left in a diagonal direction. As a result, two B colors can be faced with each other vertically on the right side.

Further, with regard to the color of respective unit pixel sections 1 in a Bayer arrangement in two image unit pixel sections 5, each shared by four pixels, in the second column (in a vertical direction), the direction of two G colors in a diagonal direction is alternately changed. Specifically, the arrangement is changed from the two G colors from the upper left to the lower right, to the two G colors from the upper right to the lower left. Further, the line of the R and B colors from the upper right to the lower left in a diagonal direction is changed to the line of the B and R colors from the upper left to the lower right in a diagonal direction. As a result, two B colors can be faced with each other vertically on the left side.

As such, four B colors can be gathered in such a manner that the four can be adjacent to one another. Similarly, four R colors can be gathered in such a manner that the four can be adjacent to one another, and four G colors can be gathered in such a manner that the four can be adjacent to one another. In summary, the replacement of the colors of respective unit pixel sections 1 in a Bayer arrangement allows four of the same color to be gathered adjacent to one another.

A CMOS image sensor as a solid-state imaging element 30 has, on a front surface side of a semiconductor substrate (or a semiconductor layer), an electric charge accumulating region (photodiode 2 as a light receiving section) for accumulating signal charges generated by light irradiation, and a plurality of unit pixel sections 1 arranged in two dimensions, each of which includes an electric charge transfer transistor 3 for transferring the signal charges of the photodiode 2 to the floating diffusion section 4. In the CMOS image sensor, each of the plurality of photodiodes 2 is formed in a square or rectangle in a plan view, a pixel separating electrode 7 is disposed in between unit pixel sections 1 adjacent to two sides of a photodiode 2 that are not adjacent to the electric charge transfer transistor 3, and a given voltage is applied to the pixel separating electrode 7. As a result, a signal charge can be shared between unit pixel sections 1 adjacent to two sides of a photodiode 2 that are not adjacent to the electric charge transfer transistor 3. 2×2 unit (4 pixels) expansion is made in order to form a captured image with respective colors of R, G and B during low illumination intensity, and four unit pixel sections 1 of the same color are integrated as one into one pixel with a large area. As a result, the effective photodiode size can be expanded up to four times, and the amount of accumulated signal charges can be multiplied by four.

Figure 3:
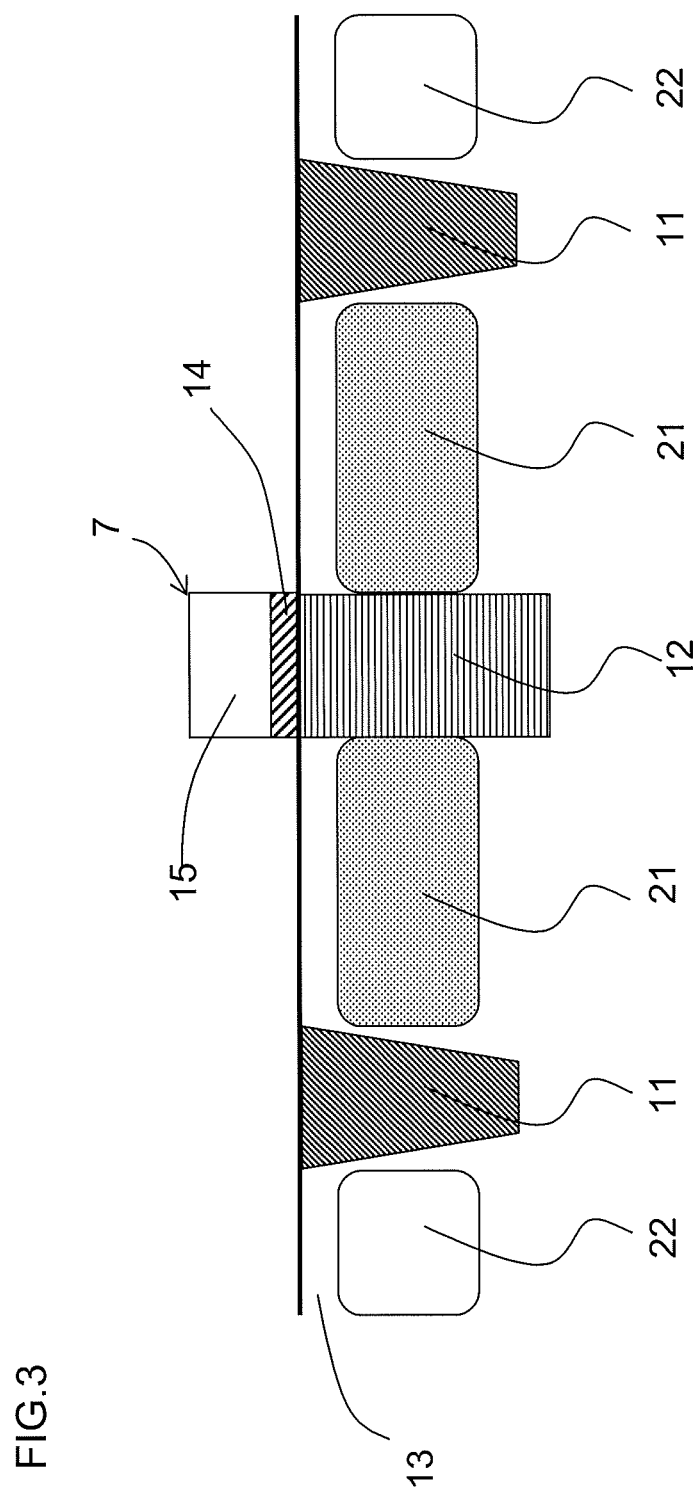
FIG. 3 is a longitudinal cross sectional view along the line A-A' in FIG. 2.

FIG. 3 is a longitudinal cross sectional view along the line A-A' in FIG. 2.

As illustrated in FIG. 3, among adjoining pixels, an element separating region 11 lies in between pixels of different colors (between a photodiode 21 and a photodiode 22), and a pixel separating region 12 lies in between pixels of the same color (between a photodiode 21 and a photodiode 21).

The element separating region 11 is typically formed using an STI (Shallow Trench Isolation) method, and the pixel separating region 12 is formed by ion implantation of a conductivity type different from the photodiode 21. In addition, on the side closer to a surface 13 of a silicon substrate of the pixel separating region 12, a gate electrode (pixel separating electrode 7) is formed which consists of a gate oxide film 14 and a polysilicon film 15 thereon. For example, the film thickness of the gate oxide film 14 can be 60 to 70 angstroms, and the film thickness of the polysilicon film 15 can be 1500 to 2000 angstroms.

The operation of sharing a signal charge among adjoining pixels with the structures described above will be described in detail with reference to FIGS. 4 and 5.

Figure 4:
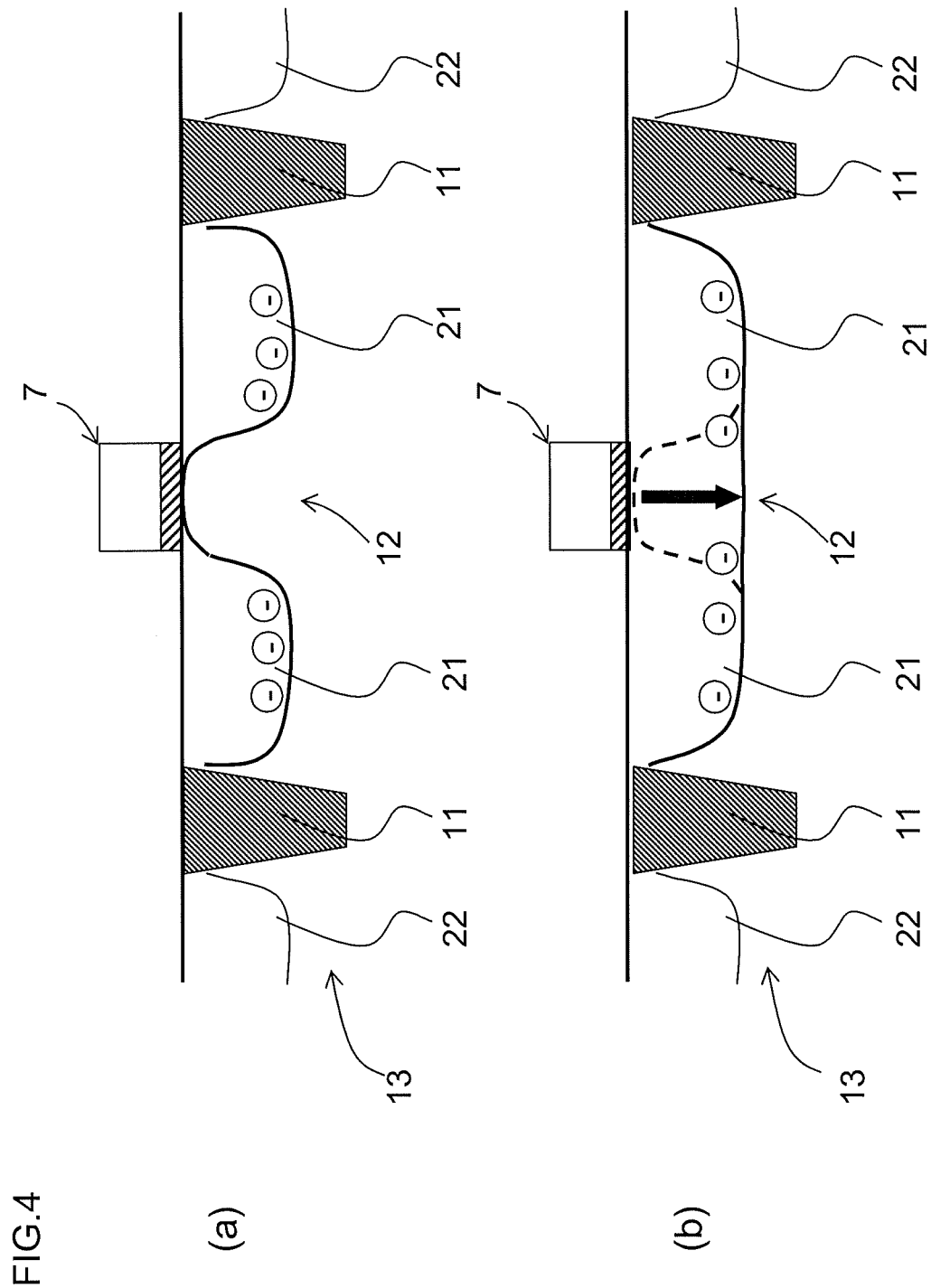
FIG. 4 is a cross sectional potential diagram along the line A-A' in FIG. 2.
Figure 5:
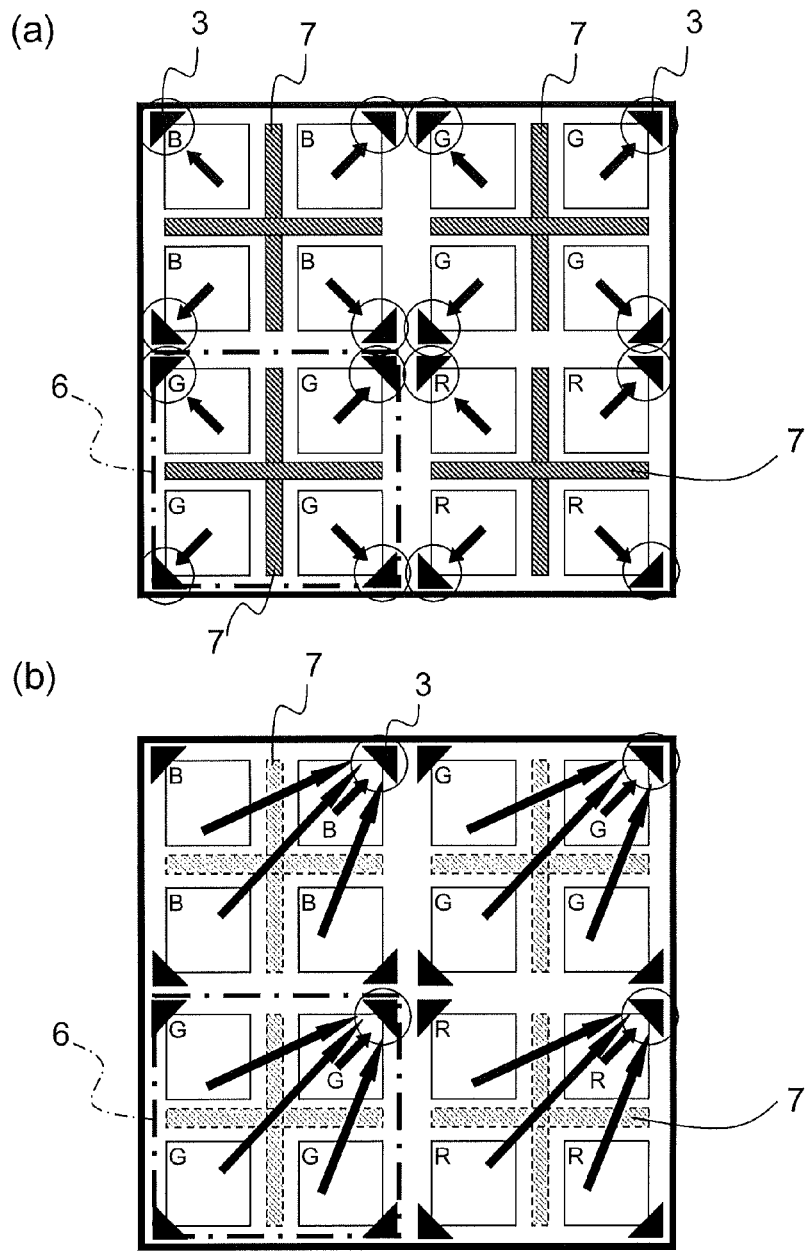
FIG. 5(a) is a pixel arrangement plan illustrating a direction in which electric charges are transferred between photodiodes in a high illumination intensity operation.
FIG. 5(b) is a pixel arrangement plan illustrating a direction in which electric charges are transferred between photodiodes in a low illumination intensity operation.

FIG. 4 is a cross sectional potential diagram along the line A-A' in FIG. 2. FIG. 4(a) is a cross sectional potential diagram of a case where a gate electrode is in an OFF state during high illumination intensity. FIG. 4(b) is a cross sectional potential diagram of a case where a gate electrode is in an ON state during low illumination intensity.

When light is irradiated, signal charges are accumulated in the photodiodes 21 and 22, and the signal charges are converted into pixel signals (imaging signals) by typical electric charge transferring and amplification operations of a CMOS image sensor. During high illumination intensity, the gate electrode (pixel separating electrode 7) is in an OFF state as illustrated in FIG. 4(a). Therefore, the pixel separating region 12 lies in between a photodiode 21 and an adjoining photodiode 21. Each of the signal charges accumulated in the photodiode 21 and adjoining photodiode 21 (represented as electrons e− in the subject figure) is transferred independently and successively. On the other hand, during low illumination intensity, the gate electrode (pixel separating electrode 7) is in an ON state as illustrated in FIG. 4(b). Therefore, a depletion layer extends itself from the side closer to the surface 13 of the silicon substrate immediately below the gate electrode (pixel separating electrode 7), and the potential barrier illustrated with a broken line disappears from between the photodiode 21 and adjoining photodiode 21, resulting in the signal charges (represented as electrons e− in the subject figure) of the photodiode 21 and adjoining photodiode 21 to be shared. In this state, a gate voltage applied to the gate electrode (pixel separating electrode 7) is determined in accordance with a potential depth of the photodiode 2, and it generally corresponds from 2.5 V to 3.0 V.

FIG. 5(a) is a pixel arrangement plan illustrating a direction in which electric charges are transferred between photodiodes in a high illumination intensity operation. FIG. 5(b) is a pixel arrangement plan illustrating a direction in which electric charges are transferred between photodiodes in a low illumination intensity operation.

During high illumination intensity, the gate electrode (pixel separating electrode 7) is in an OFF state as illustrated in FIG. 5(a). Therefore, respective signal charges of four unit pixel sections 1 accumulated in the photodiode 21 and adjoining photodiode 21 are transferred in the direction of the electric charge transfer transistor 3 adjacent to each of the unit pixel sections 1 of the adjoining unit pixel section 6 of the same color, which is surrounded by a single dotted chain line.

During low illumination intensity, the gate electrode (pixel separating electrode 7) is in an ON state as illustrated in FIG. 5(b). Therefore, respective signal charges of adjoining four pixels (four unit pixel sections 1) of the same color are gathered together to be simultaneously transferred in the direction of the electric charge transfer transistor 3 in one point at the upper right corner of the adjoining unit pixel section 6 of the same color, which is surrounded by a single dotted chain line.

In this stage, since signal charges of four pixels are transferred by the electric charge transfer transistor 3 at one point, an output image is output in accordance with the electric charge transfer transistor 3, transferring out at a pitch of every two pixels. Since the transfer operation is performed by a sequence operation of a peripheral circuit (e.g., a driver circuit) in the periphery of an imaging region of the center portion, the explanation will be omitted in the description of the present invention.

As previously described, during low illumination intensity, the reading of signal charges of adjoining four pixels of the same color is completed in one time by the electric charge transfer transistor 3 at one point on the upper right, compared to the reading of the signals in four times successively in a time series from four unit pixel sections 1 by the image unit pixel section 5 shared by four pixels. Further, the light is received with a wider area and signals can be read at a faster rate. As a result, it becomes more difficult for noise to be introduced, the accuracy of signal charges accumulated during a darker period is improved, the shutter speed can be set to be faster during low illumination intensity, influence due to camera shake is reduced, and clearer images can be captured during low illumination intensity.

In addition, since the adjoining four pixels are integrated together during low illumination intensity, clearer images can be obtained, compared to the case where pixel addition is performed on signal charges which are located at separate locations, such as every other location.

FIGS. 6(a) to 6(c) are plan views illustrating a manufacturing process of a color filter forming step of a solid-state imaging element according to the present invention.

First, as illustrated in FIG. 6(a), Green filters 31 are formed above a pixel region 34, on which a plurality of unit pixel sections 1 are disposed two dimensionally. The Green filters 31 are formed above a solid line region, which is one size larger than a region of four adjoining photodiodes 21, in such a manner to correspond to this region, at each green color position in a Bayer arrangement, with an interlayer insulation film interposed therebetween. The Green filters 31 are disposed in a direction on a right diagonal. The Green filter 31 has an area which is four times larger since the adjoining pixel sections are in the same color, and the restriction of the overlapping is significantly lessened.

Next, as illustrated in FIG. 6(b), a Red filter 32 is formed above the pixel region 34, on which a plurality of unit pixel sections 1 are disposed two dimensionally. The Red filter 32 is formed above a solid line region, which is one size larger than a region of four adjoining photodiodes 22, in such a manner to correspond to this region, at a red color position in a Bayer arrangement, with an interlayer insulation film interposed therebetween. The Red filter 32 has an area which is four times larger since the adjoining pixel sections are in the same color, and the restriction of the overlapping is significantly lessened.

Then, as illustrated in FIG. 6(c), a Blue filter 33 is formed above the pixel region 34, on which a plurality of unit pixel sections 1 are disposed two dimensionally. The Blue filter 33 is formed above a solid line region, which is one size larger than a region of four adjoining photodiodes 23, in such a manner to correspond to this region, at a blue color position in a Bayer arrangement, with an interlayer insulation film interposed therebetween. As similar to the Green filter 31, the Red filter 32 and Blue filter 33 can be widely formed in a region of the same color. The Blue filter 33 has an area which is four times larger since the adjoining pixel sections are in the same color, and the restriction of the overlapping is significantly lessened.

Further, a color filter forming step, in a method for manufacturing the solid-state imaging element 30 according to Embodiment 1, will be described in detail.

First, a green color resist film of a negative type dye, obtained from a negative type resist containing green pigment, is applied on a planarization film, which is an interlayer insulation film. The green color resist film is exposed and developed in a given pattern, and a single layered Green filter 31 is formed at a position corresponding to the green pixel in a Bayer arrangement.

Next, a red color resist film of a negative type dye, obtained from a negative type resist containing red pigment, is applied. The red color resist film is exposed and developed in a given pattern, and a Red filter 32 is formed at a position corresponding to the red pixel in a Bayer arrangement.

Then, a blue color resist film of a negative type dye, obtained from a negative type resist containing blue pigment, is applied. The blue color resist film is exposed and developed in a given pattern, and a single layered Blue filter 33 is formed at a position corresponding to the blue pixel in a Bayer arrangement. As such, color filters of interest consisting of the Green filter 31, Red filter 32 and Blue filter 33 can be formed.

The method for manufacturing the solid-state imaging element 30 according to Embodiment 1 will be briefly described hereinafter. The method for manufacturing the solid-state imaging element 30 includes, as an example, the following steps: an opposite conductivity type semiconductor region forming step of forming an opposite conductivity type semiconductor region of a conductivity type opposite from that of a photodiode 2, in between four unit pixel sections 1, which are adjacent to two sides of the photodiode 2 that do not come in contact with an electric charge transfer transistor 3, and which are adjacent to one another; a pixel separating electrode step of forming a polysilicon electrode 15, as a pixel separating electrode 7, above the opposite conductivity type semiconductor region with a gate oxide film 14 interposed therebetween; and a color filter forming step of forming a Red filter 32, a Green filter 31 and a Blue filter 33 successively in any order in a given color arrangement above a pixel region 34 with an interlayer insulation film interposed therebetween, in such a manner to correspond to each adjoining unit pixel section consisting of adjoining four unit pixel sections 1.

According to Embodiment 1 as described above, a pixel separating electrode 7, consisting of a gate oxide film 14 and a polysilicon electrode 15, is disposed in between four pixels which are adjacent to two sides of a photodiode 2 that do not come in contact with an electric charge transfer transistor 3. A given bias voltage is applied to the pixel separating electrode 7 in accordance with the amount of incident light, thus allowing a signal charge between adjoining pixels to be shared by four pixels of the same color. In this case, the shared four pixels can be regarded as an effectively expanded photodiode 2. Further, by forming adjoining pixels with the same color, a signal charge corresponding to a respective color can be regarded as being increased by the sharing. As such, high illumination intensity and low illumination intensity can be switched with each other by the presence or absence of the application of the bias voltage to the pixel separating electrode 7, so that a dynamic range can be widely used.

In a conventional step of forming a color filter with different colors, it was necessary to increase the accuracy in alignment between filters as a result of the downsizing of a pixel size. However, by forming adjoining four pixels with the same color, a plurality of pixels can be grouped as one and the area of a color filter can be enlarged even if the miniaturization of pixels advances. As a result, the alignment margin of the color filter forming step can be improved, and the accuracy in the overlapping region of color filters is reduced, thereby largely allowing for lesser alignment accuracy.

As described above, sensitivities according to light illumination intensity can be switched by bias controlling in the pixel separating region. In addition, the alignment accuracy in manufacturing of color filters can be lessened. Therefore, the solid-state imaging element 30 according to Embodiment 1 has excellent photodiode characteristics, and it can be widely used for electronic information devices which can use a solid-state imaging element, such as a video camera, a digital camera, a camera equipped cell phone device and the like.

Embodiment 2

Figure 7:
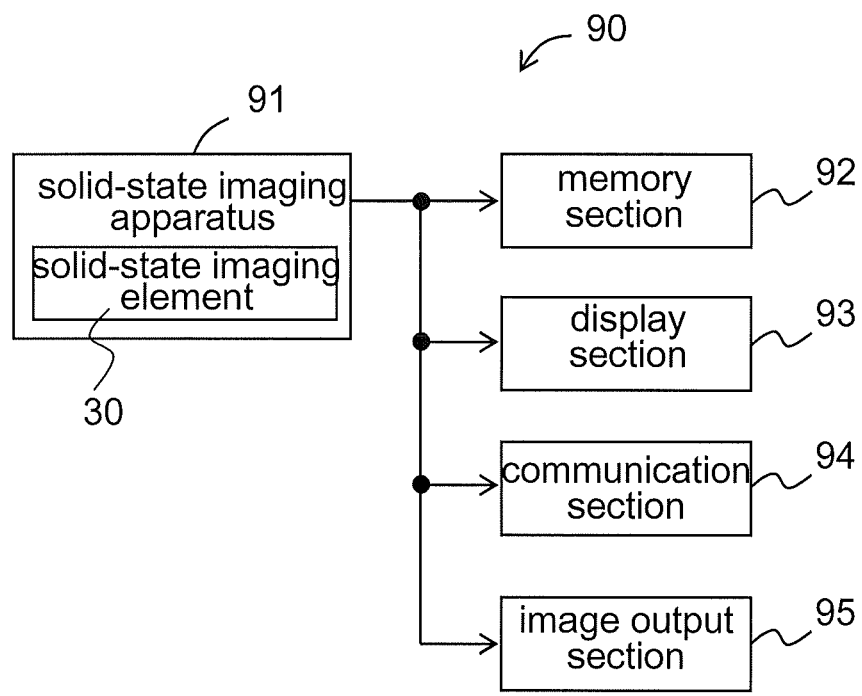
FIG. 7 is a block diagram illustrating an example of a diagrammatic structure of an electronic information device with a solid-state imaging device, including the solid-state imaging element according to Embodiment 1 of the present invention, in an imaging section thereof, as Embodiment 2 of the present invention.
Figure 8:
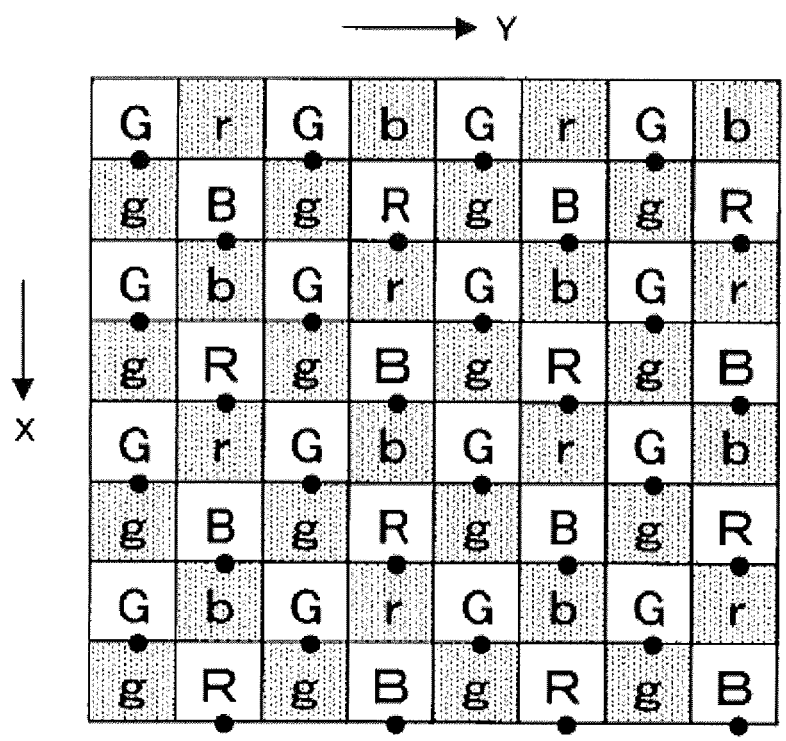
FIG. 8 is a plan view of a partial imaging region, illustrating a pixel arrangement for improving the sensitivity at low illumination intensity in the conventional solid-state imaging element disclosed in Patent Literature 1.

FIG. 7 is a block diagram illustrating an example of a diagrammatic structure of an electronic information device with a solid-state imaging device, including the solid-state imaging element 30 according to Embodiment 1 of the present invention, in an imaging section thereof, as Embodiment 2 of the present invention.

In FIG. 7, an electronic information device 90 according to Embodiment 2 of the present invention includes: a solid-state imaging apparatus 91 for performing various signal processing on an imaging signal from the solid-state imaging element 30 according to Embodiment 1 so as to obtain a color image signal; a memory section 92 (e.g., recording media) for data-recording a color image signal from the solid-state imaging apparatus 91 after predetermined signal processing is performed on the color image signal for recording; a display section 93 (e.g., a liquid crystal display apparatus) for displaying the color image signal from the solid-state imaging apparatus 91 on a display screen (e.g., liquid crystal display screen) after predetermined signal processing is performed on the color image signal for display; a communication section 94 (e.g., a transmitting and receiving device) for communicating the color image signal from the solid-state imaging apparatus 91 after predetermined signal processing is performed on the color image signal for communication; and an image output section 95 (e.g., a printer) for printing the color image signal from the solid-state imaging apparatus 91 after predetermined signal processing is performed for printing. Without any limitations to this, the electronic information device 90 may include any of the memory section 92, the display section 93, the communication section 94, and the image output section 95, such as a printer.

As the electronic information device 90, an electronic information device that includes an image input device is conceivable, such as a digital camera (e.g., digital video camera or digital still camera), an image input camera (e.g., a monitoring camera, a door phone camera, a camera equipped in a vehicle for back view monitoring, or a television telephone camera), a scanner, a facsimile machine, a camera-equipped cell phone device and a portable digital assistant (PDA).

Therefore, according to Embodiment 2 of the present invention, the color image signal from the sensor module 91 can be: displayed on a display screen properly; printed out on a sheet of paper using an image output section 95; communicated properly as communication data via a wire or a radio; stored properly at the memory section 92 by performing predetermined data compression processing; and further various data processes can be properly performed.

Although not specifically described in Embodiment 1 above, an opposite conductivity type semiconductor region, which has a conductivity opposite from that of the light receiving section, and a pixel separating electrode thereon are disposed in between four unit pixel sections which are adjacent to one another. Further, a given voltage is applied to the pixel separating electrode. As a result, a signal charge can be shared by four unit pixel sections. At the same time, a red filter, green filters and a blue filter are formed in a given color arrangement above a pixel region with an interlayer insulation film interposed therebetween, in such a manner to correspond to each of an adjoining unit pixel section consisting of the four unit pixel sections. As a result, a pixel separating electrode is disposed in a pixel separating region and a given voltage is applied to the pixel separating electrode to allow adjoining pixels to share a signal charge. Thereby, the following objectives of the present invention can be achieved: it becomes unnecessary to form the high sensitivity photoelectric conversion elements and low sensitivity photoelectric conversion elements in different steps as done conventionally; they can be manufactured more easily; and the sensitivity in low illumination intensity can be significantly improved. In addition, a pixel separating electrode is disposed above a pixel separating region and voltage is applied to the pixel separating electrode to allow adjoining pixels to share a signal charge. Thereby, the following objectives of the present invention can be achieved: even if the miniaturization of the pixels progresses, it allows a plurality of pixels to be as one and the area of color filters to be enlarged, thereby allowing for significantly lesser accuracy in the overlapping portion of respective color filters.

As described above, the present invention is exemplified by the use of its preferred Embodiments 1 and 2. However, the present invention should not be interpreted solely based on Embodiments 1 and 2 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 and 2 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied to the field of a solid-state imaging element constituted of semiconductor elements for performing a photoelectric conversion on, and capturing an image of, incident light; a method for manufacturing the solid-state imaging element; and an electronic information device, such as a digital camera (e.g., a digital video camera or a digital still camera), an image input camera (e.g., a monitoring camera), a scanner, a facsimile machine, a television telephone device, and a camera-equipped cell phone device, which electronic information device includes the solid-state imaging element as an image input device used in an imaging section thereof. According to the present invention, voltage is applied to the pixel separating electrode, and a signal charge can be shared by adjoining pixels. Owing to these definitions, a sensitivity in accordance with illumination intensity by bias controlling of the pixel separating region can be obtained. In addition, alignment accuracy in the manufacturing of color filters can be lessened. Accordingly, the solid-state imaging element of the present invention is excellent in its photodiode characteristics, which allows it to be used in a wide variety of electronic information devices, such as a video camera, a digital camera and a camera-equipped cell phone device.

The invention claimed is:

1. A solid-state imaging element, in which a plurality of unit pixel sections are disposed two dimensionally on a side closer to a front surface of a semiconductor substrate or a semiconductor layer, each unit pixel section having a light receiving section for generating a signal charge by light irradiation, the solid-state imaging element comprising: an opposite conductivity type semiconductor region disposed in between four unit pixel sections which are adjacent to one another and which have light receiving sections having a same conductivity, a conductivity of the opposite conductivity type semiconductor region being opposite of that of the light receiving sections of the four adjacent unit pixel sections; and a pixel separating electrode above the opposite conductivity type semiconductor region, wherein a given voltage is applied to the pixel separating electrode to allow a signal charge to be shared by the four adjacent unit pixel sections.

2. A solid-state imaging element, in which light receiving sections for generating a signal charge by light irradiation are provided on a side closer to a front surface of a semiconductor substrate or a semiconductor layer, and a plurality of unit pixel sections are disposed two dimensionally, each unit pixel section including a light receiving section and being provided with an electric charge transferring section, adjacent to the light receiving sections, for transferring a signal charge from the light receiving sections,
wherein:
the light receiving sections are formed in a square or rectangle in a plan view;
an opposite conductivity type semiconductor region is disposed in between four unit pixel sections which are adjacent to one another and which have light receiving sections having a same conductivity, a conductivity of the opposite conductivity type semiconductor region being opposite of that of the light receiving sections of the four adjacent unit pixel sections, and
a pixel separating electrode is disposed above the opposite conductivity type semiconductor region
each of the four adjacent unit pixel sections is adjacent to two sides of light receiving sections, the two sides being sides that do not come in contact with the electric charge transferring section; and
a given voltage is applied to the pixel separating electrode to allow a signal charge to be shared by the four adjacent unit pixel sections.

3. A solid-state imaging element according to claim 1, wherein the four adjacent unit pixel sections are an adjoining 2×2 unit.

4. A solid-state imaging element according to claim 2, wherein the four adjacent unit pixel sections are an adjoining 2×2 unit.

5. A solid-state imaging element according to claim 1, wherein the opposite conductivity type semiconductor region and the pixel separating electrode are in a cross shape in a plan view, formed in between the four adjacent unit pixel sections.

6. A solid-state imaging element according to claim 2, wherein the opposite conductivity type semiconductor region and the pixel separating electrode are in a cross shape in a plan view, formed in between the four adjacent unit pixel sections.

7. A solid-state imaging element according to claim 1, wherein a red filter, green filters and a blue filter are formed in a given color arrangement above a pixel region with an interlayer insulation film interposed therebetween, in such a manner to correspond to each adjoining unit pixel section consisting of the four adjacent unit pixel sections.

8. A solid-state imaging element according to claim 2, wherein a red filter, green filters and a blue filter are formed in a given color arrangement above a pixel region with an interlayer insulation film interposed therebetween, in such a manner to correspond to each adjoining unit pixel section consisting of the four adjacent unit pixel sections.

9. A solid-state imaging element according to claim 7, wherein the given color arrangement is such that colors are arranged in a modified Bayer arrangement such that when two green pixels are arranged in one of diagonal directions, a red pixel and a blue pixel are arranged in the other of the diagonal directions; and an arranging order of the red pixel and the blue pixel is alternately opposite, and a diagonal direction of the two green pixels is also alternately opposite.

10. A solid-state imaging element according to claim 8, wherein the given color arrangement is such that colors are arranged in a modified Bayer arrangement such that when two green pixels are arranged in one of diagonal directions, a red pixel and a blue pixel are arranged in the other of the diagonal directions; and an arranging order of the red pixel and the blue pixel is alternately opposite, and a diagonal direction of the two green pixels is also alternately opposite.

11. A solid-state imaging element according to claim 1, wherein four adjacent unit pixel sections, which share a floating diffusion section, are constituted as one unit, and a signal charge of the light receiving section is transferred to the floating diffusion section.

12. A solid-state imaging element according to claim 2, wherein four adjacent unit pixel sections, which share a floating diffusion section, are constituted as one unit, and a signal charge of the light receiving section is transferred to the floating diffusion section.

13. A solid-state imaging element according to claim 11, wherein colors of the four adjacent unit pixel sections are arranged in a modified Bayer arrangement, such that four unit pixel sections adjacent top and bottom as well as left and right of said unit pixel sections are constituted as unit pixel sections of the same color.

14. A solid-state imaging element according to claim 12, wherein colors of the four adjacent unit pixel sections are arranged in a modified Bayer arrangement, such that four unit pixel sections adjacent top and bottom as well as left and right of said unit pixel sections are constituted as unit pixel sections of the same color.

15. A solid-state imaging element according to claim 1, wherein:
signal charges accumulated in an adjoining unit pixel section, corresponding to a same color filter consisting of the four adjacent unit pixel sections, are transferred from the electric charge transferring section, being integrated as one pixel, when a given voltage is applied to the pixel separating electrode during low illumination intensity, and
a given voltage is not applied to the pixel separating electrode during high illumination intensity, so that the four adjacent unit pixel sections become independent from one another and the signal charges are transferred from the electric charge transferring section corresponding to the unit pixel section.

16. A solid-state imaging element according to claim 2, wherein:
signal charges accumulated in an adjoining unit pixel section, corresponding to a same color filter consisting of the four adjacent unit pixel sections, are transferred from the electric charge transferring section, being integrated as one pixel, when a given voltage is applied to the pixel separating electrode during low illumination intensity, and
a given voltage is not applied to the pixel separating electrode during high illumination intensity, so that the four adjacent unit pixel sections become independent from one another and the signal charges are transferred from the electric charge transferring section corresponding to the unit pixel section.

17. A solid-state imaging element according to claim 15, wherein during the low illumination intensity, electric charges are transferred from the electric charge transferring section at one point for each adjoining unit pixel section corresponding to the same color filter consisting of the four adjacent unit pixel sections.

18. A solid-state imaging element according to claim 16, wherein during the low illumination intensity, electric charges are transferred from the electric charge transferring section at one point for each adjoining unit pixel section corresponding to the same color filter consisting of the four adjacent unit pixel sections.

19. A solid-state imaging element according to claim 1, wherein filters of the same color are formed above the adjoining unit pixel section consisting of the adjoining four adjacent unit pixel sections.

20. A solid-state imaging element according to claim 2, wherein filters of the same color are formed above the adjoining unit pixel section consisting of the adjoining four adjacent unit pixel sections.

21. A solid-state imaging element according to claim 1, wherein the pixel separating electrode consists of a gate oxide film and a polysilicon electrode thereon.

22. A solid-state imaging element according to claim 2, wherein the pixel separating electrode consists of a gate oxide film and a polysilicon electrode thereon.

23. A solid-state imaging element according to claim 2, wherein the electric charge transferring section is provided at a corner portions of the light receiving section.

24. A solid-state imaging element according to claim 1, wherein the solid-state imaging element is an CMOS type solid-state imaging element, in which a signal charge transferred from at least one of the light receiving sections to a floating diffusion section is converted into a voltage signal, is amplified and then output as an imaging signal.

25. A solid-state imaging element according to claim 2, wherein the solid-state imaging element is an CMOS type solid-state imaging element, in which a signal charge transferred from at least one of the light receiving sections to a floating diffusion section is converted into a voltage signal, is amplified and then output as an imaging signal.

26. A method for manufacturing a solid-state imaging element according to claim 1, the method comprising:
    an opposite conductivity type semiconductor region forming step of forming an opposite conductivity type semiconductor region in between four unit pixel sections, which are adjacent to one another, and which are adjacent to two sides of light receiving sections that do not come in contact with an electric charge transferring section, wherein a conductivity type of the opposite conductivity type semiconductor layer is opposite from that of the light receiving sections of the four adjacent unit pixel sections; and
    a pixel separating electrode step of forming a polysilicon electrode, as a pixel separating electrode, above the opposite conductivity type semiconductor region with a gate oxide film interposed therebetween.

27. A method for manufacturing a solid-state imaging element according to claim 26, a color filter forming step of forming a Red filter, a Green filter and a Blue filter successively in any order in a given color arrangement above a pixel region with an interlayer insulation film interposed therebetween, in such a manner to correspond to each adjoining unit pixel section consisting of the four adjacent unit pixel sections.

28. A method for manufacturing a solid-state imaging element according to claim 2, the method comprising:
    an opposite conductivity type semiconductor region forming step of forming an opposite conductivity type semiconductor region in between four unit pixel sections, which are adjacent to one another, and which are adjacent to two sides of light receiving sections that do not come in contact with an electric charge transferring section, wherein a conductivity type of the opposite conductivity type semiconductor layer is opposite from that of the light receiving sections of the four adjacent unit pixel sections; and
    a pixel separating electrode step of forming a polysilicon electrode, as a pixel separating electrode, above the opposite conductivity type semiconductor region with a gate oxide film interposed therebetween.

29. A method for manufacturing a solid-state imaging element according to claim 28, a color filter forming step of forming a Red filter, a Green filter and a Blue filter successively in any order in a given color arrangement above a pixel region with an interlayer insulation film interposed therebetween, in such a manner to correspond to each adjoining unit pixel section consisting of the four adjacent unit pixel sections.

30. An electronic information device comprising the solid-state imaging element according to claim 1, as an image input device in an imaging section thereof.

31. An electronic information device comprising the solid-state imaging element according to claim 2, as an image input device in an imaging section thereof.

* * * * *